US009969896B2

(12) United States Patent
Cho et al.

(10) Patent No.: US 9,969,896 B2
(45) Date of Patent: May 15, 2018

(54) INDIUM-ZINC-OXIDE SEMICONDUCTOR INK COMPOSITION IN WHICH A SPONTANEOUS COMBUSTION REACTION OCCURS, AND INORGANIC SEMICONDUCTOR THIN FILM PRODUCED THEREBY

(71) Applicant: KOREA RESEARCH INSTITUTE OF CHEMICAL TECHNOLOGY, Daejeon (KR)

(72) Inventors: Song yun Cho, Daejeon (KR); Chang Jin Lee, Daejeon (KR); Young Hun Kang, Busan (KR)

(73) Assignee: KOREA RESEARCH INSTITUTE OF CHEMICAL TECHNOLOGY, Daejeon (KR)

( * ) Notice: Subject to any disclaimer, the term of this patent is extended or adjusted under 35 U.S.C. 154(b) by 411 days.

(21) Appl. No.: 14/736,789

(22) Filed: Jun. 11, 2015

(65) Prior Publication Data
US 2015/0275017 A1    Oct. 1, 2015

Related U.S. Application Data

(63) Continuation of application No. PCT/KR2013/011357, filed on Dec. 9, 2013.

(30) Foreign Application Priority Data

Dec. 14, 2012  (KR) .................. 10-2012-0146086
Dec. 4, 2013   (KR) .................. 10-2013-0149940

(51) Int. Cl.
*C09D 11/52*   (2014.01)
*C08K 5/56*    (2006.01)
(Continued)

(52) U.S. Cl.
CPC ............. *C09D 11/52* (2013.01); *C08K 5/56* (2013.01); *H01L 21/02554* (2013.01);
(Continued)

(58) Field of Classification Search
CPC ..... C09D 11/52; C08K 5/56; H01L 21/02554; H01L 21/02565; H01L 21/02628; H01L 27/1292; H01L 29/66969
(Continued)

(56) References Cited

U.S. PATENT DOCUMENTS 8,940,578 B2 * 1/2015 Facchetti .......... H01L 21/02565
                                                      257/43
9,404,002 B2 * 8/2016 Fujdala .................. C09D 11/52
(Continued)

FOREIGN PATENT DOCUMENTS

KR    1020110106175 A    9/2011
KR    1020110108064 A    10/2011
(Continued)

OTHER PUBLICATIONS

International Search Report for PCT/KR2013/011357, dated Mar. 20, 2014; 2 pages.*
(Continued)

*Primary Examiner* — Helene Klemanski
(74) *Attorney, Agent, or Firm* — Ladas & Parry LLP; Loren K. Thompson (57) ABSTRACT

The aim of the present invention is to provide an indium-zinc-oxide semiconductor ink composition in which a spontaneous combustion reaction occurs, and provide an inorganic semiconductor thin film produced thereby. To this end, the present invention provides a semiconductor ink composition which includes a complex, represented by formula 1, incorporating a nitrate of a metal A which is an oxidizing material and incorporating a metal B which is a fuel mate-
(Continued)

rial; wherein the metal A and the metal B are each respectively a metal selected from the group consisting of indium, gallium, zinc, titanium, aluminum, lithium, and zirconium, and metal A and metal B are different from each other.

9 Claims, 3 Drawing Sheets (51) Int. Cl.
    *H01L 21/02*     (2006.01)
    *H01L 27/12*     (2006.01)
    *H01L 29/66*     (2006.01)
    *H01L 29/786*     (2006.01)
    *C08K 3/28*     (2006.01)

(52) U.S. Cl.
    CPC .. *H01L 21/02565* (2013.01); *H01L 21/02628* (2013.01); *H01L 27/1292* (2013.01); *H01L 29/66969* (2013.01); *H01L 29/7869* (2013.01); *C08K 3/28* (2013.01)

(58) Field of Classification Search
    USPC ...................................................... 106/31.92
    See application file for complete search history.

(56) References Cited

U.S. PATENT DOCUMENTS

| | | | |
|---|---|---|---|
| 9,455,142 B2* | 9/2016 | Fujdala | C09D 11/52 |
| 9,670,232 B2* | 6/2017 | Fujdala | C09D 11/52 |
| 2003/0122122 A1* | 7/2003 | Iwata | H01L 21/02554 |
| | | | 257/43 |
| 2010/0210069 A1* | 8/2010 | Seon | H01L 21/02554 |
| | | | 438/104 |
| 2011/0227007 A1* | 9/2011 | Kang | H01L 21/02628 |
| | | | 252/519.51 |
| 2011/0233532 A1* | 9/2011 | Sotzing | C25B 3/00 |
| | | | 257/40 |
| 2011/0266536 A1* | 11/2011 | Bae | H01L 29/66969 |
| | | | 257/43 |
| 2012/0049181 A1* | 3/2012 | Kim | H01L 21/02554 |
| | | | 257/43 |
| 2012/0329209 A1* | 12/2012 | Song | H01L 21/02554 |
| | | | 438/104 |
| 2013/0101867 A1* | 4/2013 | Yukinobu | C03C 17/006 |
| | | | 428/702 |
| 2013/0161620 A1* | 6/2013 | Kim | H01L 21/02554 |
| | | | 257/57 |
| 2015/0087110 A1* | 3/2015 | Facchetti | H01L 21/02554 |
| | | | 438/104 |
| 2015/0103977 A1* | 4/2015 | Ono | H01L 21/02565 |
| | | | 378/62 |
| 2015/0206957 A1* | 7/2015 | Facchetti | H01L 21/02565 |
| | | | 438/104 |
| 2015/0325803 A1* | 11/2015 | Lee | H01L 21/02425 |
| | | | 257/40 |

FOREIGN PATENT DOCUMENTS

| | | |
|---|---|---|
| KR | 1020110119880 A | 11/2011 |
| WO | WO 2012/103528 A2 * | 8/2012 |

OTHER PUBLICATIONS

English translation of the Written Opinion of the International Search Authority dated Mar. 20, 2014 for PCT/KR2013/011357; 7 pages.*
K.K. Banger, et al; "Low-temperature, high-performance solution-processed metal oxide thin-film transistors formed by a 'sol-gel on chip' process", Nature materials, vol. 10, Jan. 2011; pp. 45-50; Published online: Dec. 12, 2010.
E. Fortunato, et al; "Oxide Semiconductor Thin-Film Transistors: A Review of Recent Advances", Advanced Materials, vol. 24, pp. 2945-2986; First published: May 10, 2012.
Yong-Hoon Kim, et al; "Flexible metal-oxide devices made by room-temperature photochemical activation of sol-gel films", Nature, vol. 489, Sep. 6, 2012; pp. 128-133.
Jonathan W. Hennek, et al; "Exploratory Combustion Synthesis: Amorphous Indium Yttrium Oxide for Thin-Film Transistors", Journal of the American Chemical Society, vol. 134, pp. 9593-9596; Published: May 24, 2012.
Myung-Gil Kim, et al; "Low-temperature fabrication of high-performance metal oxide thin-film electronics via combustion processing", Nature materials, vol. 10, May 2011; pp. 362-388; Published online: Apr. 17, 2011.
Myung-Gil Kim, et al "Delayed Ignition of Autocatalytic Combustion Precursors: Low-Temperature Nanomaterial Binder Approach to Electronically Functional Oxide Films", Journal of the American Chemical Society, vol. 134, pp. 11583-11593; Published: Jun. 6, 2012.

* cited by examiner

INDIUM-ZINC-OXIDE SEMICONDUCTOR INK COMPOSITION IN WHICH A SPONTANEOUS COMBUSTION REACTION OCCURS, AND INORGANIC SEMICONDUCTOR THIN FILM PRODUCED THEREBY

BACKGROUND OF THE INVENTION

1. Field of the Invention

The present invention relates to an indium-zinc-oxide semiconductor ink composition in which a spontaneous combustion reaction occurs, and an inorganic semiconductor thin film produced thereby.

2. Description of the Related Art

As recent interest on characteristics of oxide semiconductors including diversity grows, studies have been actively undergoing. In particular, the oxide semiconductor has been applied as an active layer for the thin film transistor (TFT). The inorganic oxide semiconductor used for the above is exemplified by zinc oxide (ZnO), indium oxide (IZO), indium-zinc-oxide (IZO), indium-gallium-zinc-oxide (IGZO), and indium-zinc-tin-oxide (IZTO), etc. According to the chemical bond of the oxide, the oxide semiconductor has a comparatively big band gap of at least 3 eV, which is transparent in visible ray, is advantageous for low temperature processing, compared with silicone, and facilitates solution process with less costs and high mobility as well.

The thin film transistor element is a key part of display information appliance. That is, the element is essential for gradation of display information appliance by playing a role in switching a pixel. Therefore, the market of such thin film transistor element is growing quite big in electronic & information industry. Recent methods to prepare the oxide semiconductor are exemplified by sputtering, atomic layer deposition (ALD), pulsed laser deposition (PLD), and metal organic chemical vapor deposition (MOCVD), etc.

As the price of electronic parts of display device gets lower, the interest on electronic & information industry has been focused on the super-low-cost, large area process, and mass-production. To replace the photolithography or vacuum deposition which requires high costs, it is necessary to develop a solution based process. To prepare the thin film transistor element based on the solution process, organic semiconductors have been a target of study. However, the organic thin film transistor still has problems to be improved, which includes the basic properties of a thin film transistor such as mobility, on/off ratio, and current density, etc, and further durability and electrical reliability.

Recently there is a new attempt to produce an inorganic oxide semiconductor using a solution process. Accordingly, studies to develop a low temperature process with various materials such as indium oxide, indium-tin-oxide, aluminum and gallium added zinc oxide film, etc, have been actively going on. The solution process is exemplified by sol-gel process, metal organic decomposition (MOD), and chemical bath deposition (CBD), etc.

The sol-gel process that has been used for the production of an inorganic oxide semiconductor is characterized by spin coating using a metal precursor solution at a proper pH or ink-jet printing on a substrate, both of which require heat-treatment thereafter. During the heat-treatment, the inorganic precursor is hydrolyzed and condensated, from which a metal oxide is generated by conjugating metal and oxygen. The said inorganic precursor is exemplified by metal alkoxide, metal acetate, metal nitrate, and metal halide, etc.

The temperature for the sol-gel oxide semiconductor process is still a little too high to secure the excellent electronic characteristics. According to the previous reports, the temperature for heat treatment of ZnO, IZO, and IGZO are respectively at least 300° C., 400° C., and 450° C. (Adv. Mater. 2012, 24, 2945).

Various attempts have been made to overcome the disadvantage in the heat-treatment process of the inorganic semiconductor material. According to Shrringhaus et al., indium, gallium, and zinc alkoxide precursors were heat-treated at 275° C. in a glove box in nitrogen atmosphere to obtain the mobility of ~10 $cm^2V^{-1}s^{-1}$. According to Park et al., indium, gallium, zinc acetate, and nitrate precursors were exposed with deep-UV and heat-treated at 200° C. in a box in nitrogen atmosphere, and as a result the mobility of ~10 $cm^2V^{-1}s^{-1}$ on the aluminum oxide insulator substrate was obtained (Nature 2011, 10, 45., Nature Lett. 2012, 489, 128).

However, the above methods can only be accomplished in nitrogen atmosphere with a special device or a high-K gate insulator, indicating that the methods are not practical and have poor industrial usability thereby.

According to the study of Marks et al., a metal precursor composition that is suitable for combustion reaction was prepared by adding the fuel material Urea and the oxidizer material $NH_4NO_3$ to indium and zinc nitrate precursors. After treating the composition with high heat at 300° C., the mobility of ~3 $cm^2V^{-1}s^{-1}$ was obtained. Even though high mobility was obtained at a comparatively low temperature by using combustion reaction, the fuel material, the oxidizer material, and the base solution had to be added in addition to the metal oxide precursor. That is, the said method cannot be achieved without the quantitative addition of such materials (J. Am. Chem. Soc. 2012, 134, 9593, Nature Mater. 2011, 10, 382, J. Am. Chem. Soc. 2012, 134, 11583).

In the course of study to prepare an indium-zinc-oxide semiconductor thin film having excellent properties, the present inventors identified metal precursors in which the fuel material and the oxidizer material are coordinated. By mixing these two precursors without any additional materials, the inventors could develop an inorganic semiconductor ink composition usable for the preparation of an indium-zinc-oxide semiconductor thin film with improved charge carrier mobility and on/off ratio, leading to the completion of this invention.

SUMMARY OF THE INVENTION

It is an object of the present invention to provide an indium-zinc-oxide semiconductor ink composition in which a spontaneous combustion reaction occurs and an inorganic semiconductor thin film prepared by the same.

To achieve the above object, the present invention provides a semiconductor ink composition which comprises a complex, represented by formula 1, incorporating a nitrate of a metal A which is an oxidising material and incorporating a metal B which is a fuel material; wherein the metal A and the metal B are respectively a metal selected from the group consisting of indium, gallium, zinc, titanium, aluminum, lithium, and zirconium, and metal A and metal B are different from each other.

[Formula 1]

(Wherein, $R_1$, $R_2$ and $R_3$ are independently hydrogen or $C_1$~$C_2$ alkyl, and the said $C_1$~$C_2$ alkyl can be substituted with one or more F.)

The present invention also provides a preparation method of a semiconductor thin film using the said semiconductor ink composition comprising the following steps:

generating a film on the substrate by printing or coating the top of the substrate with the inorganic semiconductor ink composition (step 1); and heat-treating the film prepared in step 1 (step 2).

The present invention further provides a semiconductor thin film generated on top of the substrate by the preparation method above.

In addition, the present invention provides an inorganic thin film transistor wherein the semiconductor thin film prepared by the method above is laminated stepwise, a source and a drain electrode are layered on the top or under the zinc oxide semiconductor thin film, and the source and the drain electrode are separated from each other at a regular distance.

Advantageous Effect

The indium-zinc-oxide semiconductor ink composition in which a spontaneous combustion reaction occurs and the inorganic semiconductor thin film prepared by using the same of the present invention can be used as a channel material for a transistor element and facilitates the production of the inorganic thin film transistor with improved electrical properties. Also, the present invention is suitable for solution processing and so is easy to produce as a thin film and capable of low temperature processing, and can produce thin films which are dense and uniform due to a spontaneous combustion reaction that occurs on mixing two metal precursors coordinated with a fuel material and an oxidising material.

BRIEF DESCRIPTION OF THE DRAWINGS

The application of the preferred embodiments of the present invention is best understood with reference to the accompanying drawings, wherein.

BRIEF DESCRIPTION OF THE MARK OF DRAWINGS

1: substrate (gate electrode)
2: the inorganic semiconductor film of the present invention
3: source electrode (Al)
4: drain electrode

DESCRIPTION OF THE PREFERRED EMBODIMENTS

The present invention provides a semiconductor ink composition which comprises a complex, represented by formula 1, incorporating a nitrate of a metal A which is an oxidising material and incorporating a metal B which is a fuel material; wherein the metal A and the metal B are each respectively a metal selected from the group consisting of indium, gallium, zinc, titanium, aluminum, lithium, and zirconium, and metal A and metal B are different from each other.

[Formula 1]

(Wherein, $R_1$, $R_2$ and $R_3$ are independently hydrogen or $C_1$~$C_2$ alkyl, and the said $C_1$~$C_2$ alkyl can be substituted with one or more F.)

Hereinafter, the present invention is described in detail.

According to the present invention, a dense and uniform thin film can be prepared by using a spontaneous combustion reaction induced by mixing two metal precursors wherein the oxidising material and the fuel material are coordinated. The metal A (oxidising material) and the metal B (fuel material) are respectively a metal selected from the group consisting of indium, gallium, zinc, titanium, aluminum, lithium, and zirconium, and metal A and metal B are preferably different from each other.

According to the prior art, a fuel material selected from the group consisting of carbohydrazide, urea, citric acid, and glycine can be added to the oxide precursor composition. However, there might be a problem in reproducing the capacity of the transistor element since a quantitative addition of the material such as above has to be made to the composition solution, suggesting that the industrial usability practically decreases.

However, when the metal precursor comprising the complex represented by formula 1 of the present invention is used, a precursor with excellent electrical characteristics can be prepared neither with an additional material nor any special device.

As the fuel material, zinc acetylacetonate hydrate (Zn($C_5H_7O_2$)$_2$.x$H_2$O)), indium acetylacetonate hydrate (In($C_5H_7O_2$)$_3$.x$H_2$O)), gallium acetylacetonate (Ga($C_5H_7O_2$)$_3$)), zinc citrate dihydrate ($Zn_3(C_6H_5O_7)_2$.2$H_2$O)), zinc hexafluoroacetylacetonate dihydrate (Zn($C_5HF_6O_2$)$_2$.2$H_2$O)), and glycine zinc salt monohydrate (Zn$C_4H_{10}N_2O_5$)) can be used.

The semiconductor ink composition of the present invention preferably contains a nitrate of metal C as an oxidising material and at least one of the complex represented by formula 1 as a fuel material, wherein the metal C is a metal selected from the group consisting of indium, gallium, zinc, titanium, aluminum, lithium, and zirconium, and at this time the metal C is different from metal A and metal B.

The semiconductor ink composition of the present invention can be a mixture of one of the oxidising materials and one of the fuel materials, but not always limited thereto. It can also be composed of two kinds of the oxidising materials and one of the fuel materials, or one of the oxidising materials and two kinds of the fuel materials, or two kinds of the oxidising materials and two kinds of the fuel materials. At this time, the oxidising material and the fuel material are preferably different from each other (see Example 1~Example 33).

The semiconductor ink composition of the present invention can additionally include monoethyleneamine (MEA) as a stabilizer. The semiconductor ink composition is usable for the preparation of an uniform semiconductor oxide thin film characterized by coating the top of the substrate with the precursor solution wherein the precursor material is dispersed evenly, followed by heat-treating. By using the thin film, an inorganic thin film transistor with excellent reliability can be prepared. When the stabilizer, monoethyleneamine, is added, the precursor material becomes dispersed more stably in the solution, which favors the preparation of an uniform semiconductor oxide thin film.

When the metal A and the metal B are zinc or indium, the preferable molar ratio of zinc:indium is 1:0.7~1:10. Particularly, when zinc nitrate is mixed with indium acetylacetonate, or when zinc acetylacetonate is mixed with indium nitrate, the preferable molar ratio of zinc:indium is 1:0.7~1:5.

When the metal A and the metal B are indium or gallium, more specifically indium acetylacetonate and gallium nitrate or gallium acetylacetonate and indium nitrate, the molar ratio of indium:gallium is preferably 1:0.1~1:0.7, and more preferably 1:0.2~1:0.5.

Further, when the metal C is gallium, more specifically when gallium acetylacetonate or gallium nitrate is additionally added to the mixture of zinc acetylacetonate and indium nitrate or the mixture of gallium acetylacetonate and indium nitrate, the preferable molar ratio of zinc:indium:gallium is 1:1~3:0.1~2.

The inorganic thin film transistor having excellent charge carrier mobility and on/off ratio can be prepared by using the inorganic semiconductor ink composition prepared by the mixing ratios above (see Table 1 and Table 3).

In the semiconductor ink composition of the present invention, the semiconductor ink composition can additionally contain a solvent and the preferable concentration of the mixture of the oxidising material, the fuel material, and the solvent is 0.05~0.25 M.

The concentration of the semiconductor ink composition indicates the molar concentration of the precursor material to the solvent. Considering the concentration of the conventional semiconductor ink composition is approximately 0.30 M~0.50 M, the concentration of the semiconductor ink composition of the present invention is approximately 0.1 M, which is 3~5 times lighter, so that the material cost reducing effect is expected.

The solvent herein is preferably the one selected from the group consisting of isopropylalcohol, chlorobenzene, N-methyl pyrrolidone, ethanol amine, ethanol, methanol, 2-methoxyethanol, and a mixture thereof, but not always limited thereto.

The present invention also provides a preparation method of a semiconductor thin film using the said semiconductor ink composition comprising the following steps:

generating a film on the substrate by printing or coating the top of the substrate with the inorganic semiconductor ink composition (step 1); and heat-treating the film prepared in step 1 (step 2).

In the preparation method of a semiconductor thin film using the semiconductor ink composition of the present invention, step 1) is to prepare a film by printing or coating the top of the substrate with the inorganic semiconductor ink composition.

At this time, the said printing or coating in step 1) is achieved by the method selected from the group consisting of ink-jet printing, roll printing, gravure printing, aerosol printing, screen printing, roll coating, spin coating, bar coating, spray coating, and dip coating. The zinc oxide semiconductor thin film of the present invention can be prepared by one of the above printing or coating methods, and more preferably prepared by spin coating, but not always limited thereto.

In the preparation method of a semiconductor thin film using the semiconductor ink composition of the present invention, step 2) is to treat the film prepared in step 1) with heat.

In step 2, the thin film coated on the top substrate in step 1) was heat-treated, resulting in the preparation of the semiconductor thin film. In the inside of the prepared semiconductor thin film, the indium-zinc-oxide nanostructure was evenly formed, by which the film had the excellent electrical characteristics including charge carrier mobility. Also, the thin film prepared herein is dense and uniform due to the spontaneous combustion reaction caused when two metal precursors are mixed together, and accordingly the reliability of the film can be improved.

The representative chemical reaction of combustion reaction proposed in this invention is as follows.

$$5Zn(C_5H_7O_2)_2 \cdot xH_2O + 16In(NO_3)_3 \cdot xH_2O \rightarrow 5ZnO8In_2O_3(s) + 24N_2(g) + 5CO_2(g) + xH_2O(g)$$

When the combustion reaction occurs via chemical reaction between the oxidising material and the fuel material as shown in the above reaction formula, carbon dioxide and water are generated with accompanying heat.

This spontaneous combustion reaction is an important characteristic in the preparation of a semiconductor thin film by using the inorganic semiconductor ink composition of the present invention. When the metal precursor displaying oxidation properties (oxidising material) reacts to the metal precursor having combustion properties (fuel material), internal heat is generated that can be used as the energy necessary for the conversion of the precursor into the oxide. Accordingly, the required amount of energy provided for the generation of oxide becomes less, indicating that the temperature for the heat-treatment can be significantly lowered. Therefore, a big disadvantage in the conventional solution processing of an oxide semiconductor can be overcome by reducing the processing temperature herein.

In the preparation method of a semiconductor thin film using the semiconductor ink composition of the present invention, the heat treatment in step 2) is preferably performed at 200° C.~350° C., but not always limited thereto.

According to the present invention, when the oxidising material reacts to the fuel material, a spontaneous combustion reaction occurs, and thereby the temperature for oxide formation can be lowered owing to the internal heat generated via the above reaction. So, an oxide is easily formed and accordingly the electrical characteristics of the transistor comprising the semiconductor thin film can be significantly improved, which is one of the advantages of the present invention.

The present invention also provides a semiconductor thin film formed on the top of the substrate by the preparation method of the invention. The semiconductor thin film prepared by the method of the invention can be used as N-type semiconductor thin film for the inorganic thin film transistor. So, the electrical characteristics of the inorganic thin film transistor including charge carrier mobility and on/off ratio can be improved.

Figure 1:
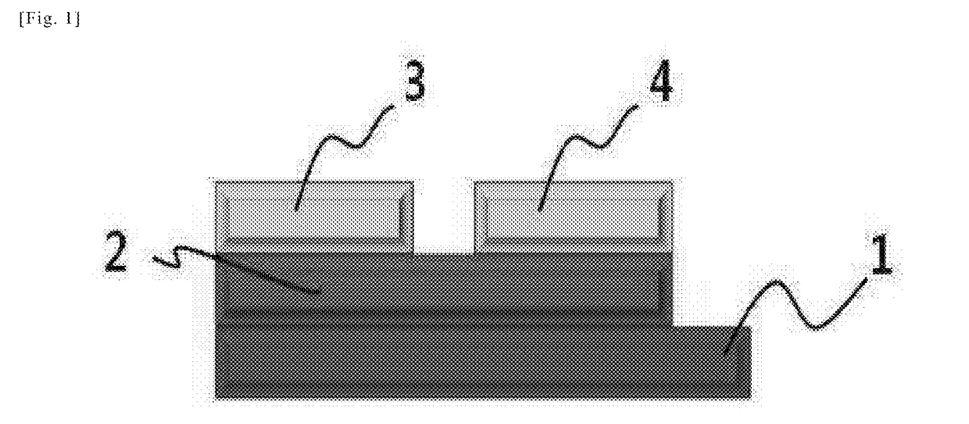
FIG. 1 is a schematic diagram illustrating the inorganic thin film transistor prepared according to the present invention.
Figure 2:
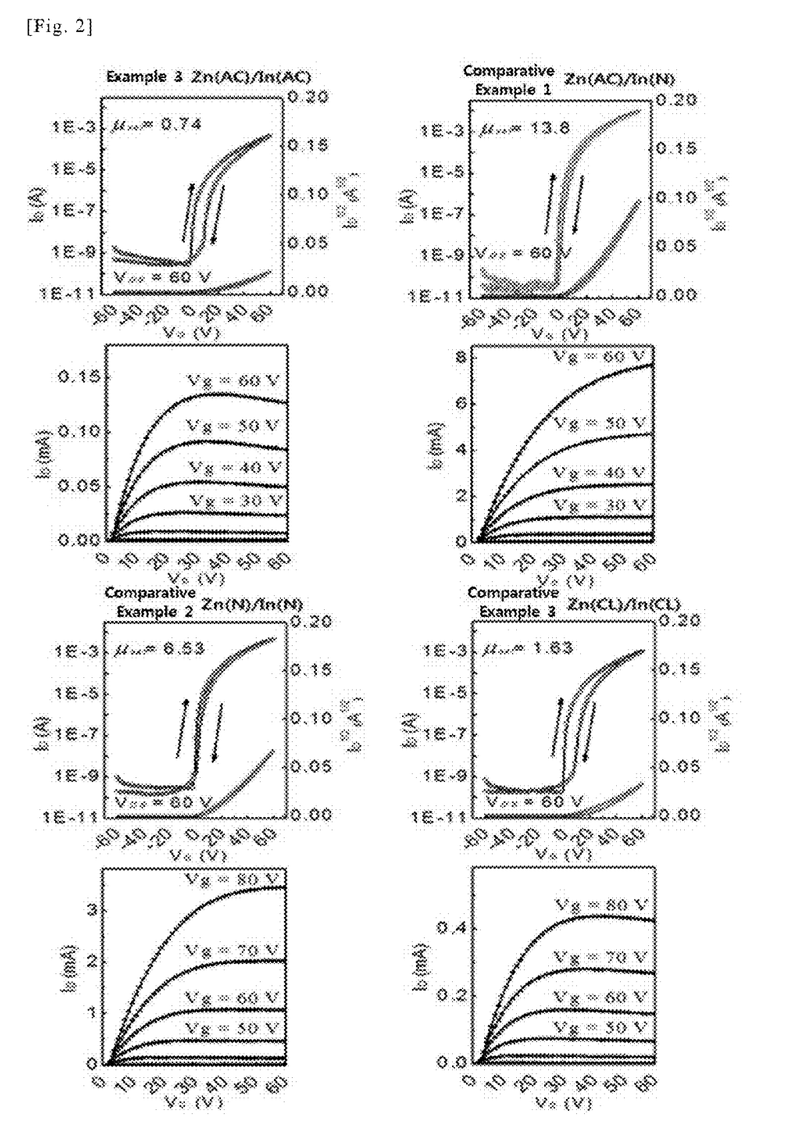
FIG. 2 is a set of graphs illustrating the current transfer characteristics of the inorganic thin film transistor prepared by using the inorganic semiconductor ink compositions of Example 3 and Comparative Example 1~Comparative Example 3.

In addition, the present invention provides an inorganic thin film transistor wherein the substrate (gate electrode) and the semiconductor thin film prepared by the method above are laminated stepwise, a source and a drain electrode are layered on the top or under the zinc oxide semiconductor thin film, and the source and the drain electrode are separated from each other at a regular distance. The schematic diagram illustrating the inorganic thin film transistor of the invention is presented in FIG. 1.

The inorganic thin film transistor of the present invention contains the semiconductor thin film in the inside of the film, so that it has excellent electronic characteristics such as charge carrier mobility and on/off ratio, etc. This transistor can also be applied to various electronic devices such as memory and display, etc, and particularly favors the preparation of a display device owing to the high permeability of the zinc oxide thin film.

The said substrate herein can be a silicone (Si) wafer, a glass substrate, or a plastic substrate. The substrate can be selected considering the target product on which the inorganic thin film transistor will be applied. For example, when the inorganic thin film transistor is applied to a memory device, the silicone (Si) wafer is selected as a substrate, and when the inorganic thin film transistor is applied to a display device, the glass substrate is selected as a substrate. Also, when the inorganic thin film transistor is applied to an electronic device requiring flexible characteristic, the plastic substrate is selected as a substrate.

Practical and presently preferred embodiments of the present invention are illustrative as shown in the following Examples.

However, it will be appreciated that those skilled in the art, on consideration of this disclosure, may make modifications and improvements within the spirit and scope of the present invention.

EXAMPLE 1-33

Preparation of Inorganic Semiconductor Ink Composition 1

Indium nitrate hydrate ($In(NO_3)_3 \cdot xH_2O$), zinc nitrate hexahydrate ($Zn(NO_3)_2 \cdot 6H_2O$), gallium nitrate hydrate ($Ga(NO_3)_3 \cdot xH_2O$), zinc acetylacetonate hydrate ($Zn(C_5H_7O_2)_2 \cdot xH_2O$), indium acetylacetonate hydrate ($In(C_5H_7O_2)_3 \cdot xH_2O$), and gallium acetylacetonate ($Ga(C_5H_7O_2)_3$) were used as starting materials. As a solvent, 2-methoxyethanol was used. The constituents were well mixed as shown in Table 1. To prepare an uniform and clear solution, the mixture was stirred at room temperature for a day, and as a result the inorganic semiconductor ink composition was obtained.

TABLE 1

| | Constituents (ratio) | | | | | |
|---|---|---|---|---|---|---|
| | Zn (ACAC) | Zn (Nitrate) | In (ACAC) | In (Nitrate) | Ga (ACAC) | Ga (Nitrate) |
| Example 1 | 0.017M | | | 0.085M | | |
| Example 2 | 0.034M | | | 0.068M | | |
| Example 3 | 0.051M | | | 0.051M | | |
| Example 4 | 0.068M | | | 0.034M | | |
| Example 5 | 0.085M | | | 0.017M | | |
| Example 6 | | 0.017M | 0.085M | | | |
| Example 7 | | 0.034M | 0.068M | | | |
| Example 8 | | 0.051M | 0.051M | | | |
| Example 9 | | 0.068M | 0.034M | | | |
| Example 10 | | 0.085M | 0.017M | | | |
| Example 11 | | | 0.017M | | | 0.085M |
| Example 12 | | | 0.034M | | | 0.068M |
| Example 13 | | | 0.051M | | | 0.051M |
| Example 14 | | | 0.068M | | | 0.034M |
| Example 15 | | | 0.085M | | | 0.017M |
| Example 16 | | | | 0.017M | 0.085M | |
| Example 17 | | | | 0.034M | 0.068M | |
| Example 18 | | | | 0.051M | 0.051M | |
| Example 19 | | | | 0.068M | 0.034M | |
| Example 20 | | | | 0.085M | 0.017M | |
| Example 21 | 0.008M | | | 0.05M | 0.042M | |
| Example 22 | 0.017M | | | 0.05M | 0.034M | |
| Example 23 | 0.025M | | | 0.05M | 0.025M | |
| Example 24 | 0.034M | | | 0.05M | 0.017M | |
| Example 25 | 0.042M | | | 0.05M | 0.008M | |
| Example 26 | 0.05M | | | 0.05M | 0.025M | |

TABLE 1-continued

| | Constituents (ratio) | | | | | |
|---|---|---|---|---|---|---|
| | Zn (ACAC) | Zn (Nitrate) | In (ACAC) | In (Nitrate) | Ga (ACAC) | Ga (Nitrate) |
| Example 27 | 0.05M | | | 0.05M | | 0.025M |
| Example 28 | 0.05M | | | 0.025M | 0.05M | |
| Example 29 | 0.06M | | | 0.005M | 0.06M | |
| Example 30 | 0.05M | | | 0.05M | | 0.025M |
| Example 31 | | 0.05M | 0.05M | | 0.012M | 0.012M |
| Example 32 | | 0.05M | 0.05M | | | 0.025M |
| Example 33 | | 0.05M | 0.05M | | 0.012M | 0.012M |

COMPARATIVE EXAMPLE 1-7

Preparation of Inorganic Semiconductor Ink Composition 2

Indium nitrate hydrate ($In(NO_3)_3 \cdot xH_2O$), zinc nitrate hexahydrate ($Zn(NO_3)_2 \cdot 6H_2O$), gallium nitrate hydrate ($Ga(NO_3)_3 \cdot xH_2O$), zinc acetylacetonate hydrate ($Zn(C_5H_7O_2)_2 \cdot xH_2O$), indium acetylacetonate hydrate ($In(C_5H_7O_2)_3 \cdot xH_2O$), gallium acetylacetonate ($Ga(C_5H_7O_2)_3$), indium chloride ($InCl_3$), and zinc chloride ($ZnCl_2$) were used as starting materials. As a solvent, 2-methoxyethanol was used. The constituents were well mixed as shown in Table 2. To prepare an uniform and clear solution, the mixture was stirred at room temperature for a day, and as a result the inorganic semiconductor ink composition was obtained.

TABLE 2

| | Constituents (ratio) | | | | | | | |
|---|---|---|---|---|---|---|---|---|
| | Zn (ACAC) | Zn (Nitrate) | Zn (Chloride) | In (ACAC) | In (Nitrate) | In (Chloride) | Ga (ACAC) | Ga (Nitrate) |
| Comparative Example 1 | 0.05M | | | 0.05M | | | | |
| Comparative Example 2 | | 0.05M | | | 0.05M | | | |
| Comparative Example 3 | | | 0.05M | | | 0.05M | | |
| Comparative Example 4 | | | | 0.068M | | | 0.034M | |
| Comparative Example 5 | | | | 0.068M | | | | 0.034M |
| Comparative Example 6 | 0.05M | | | 0.05M | | | 0.025M | |
| Comparative Example 7 | | 0.05M | | | 0.05M | | | 0.025M |

EXPERIMENTAL EXAMPLE 1

Current Transfer Characteristic of Thin Film Transistor

Figure 3:
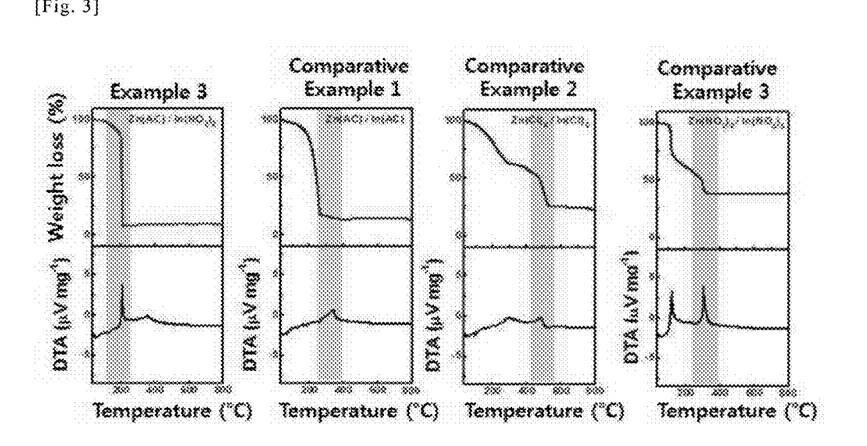
FIG. 3 is a set of graphs illustrating the thermal properties of the inorganic semiconductor ink compositions of Example 3 and Comparative Example 1~Comparative Example 3 at a low temperature.

The top of the silicone substrate deposited with 300 nm of silicone dioxide was coated with the inorganic semiconductor ink compositions prepared in the above Examples via spin coating, followed by heat-treating on a hot plate at 350° C. for 1 hour to prepare the semiconductor thin film. The source and the drain electrode (width/length=3000 μm/50 μm) were deposited on the top of the semiconductor thin film by using an evaporator to make the thickness of the film 150 nm, and as a result, the inorganic thin film transistor was prepared. Charge carrier mobility and on/off ratio of the prepared inorganic thin film transistor were measured and the results are shown in Table 3 and FIG. 3. FIG. 3 presents a set of graphs illustrating the current transfer characteristic of the thin film transistor using the inorganic thin film semiconductor ink composition prepared in Example 3 of the invention.

TABLE 3

| | | Charge carrier mobility ($cm^2/V \cdot s$) | on/off ratio (on/off ratio) |
|---|---|---|---|
| Example 1 | IZO | 7.79 | ~$10^7$ |
| Example 2 | | 8.49 | ~$10^8$ |
| Example 3 | | 13.8 | ~$10^8$ |
| Example 4 | | 1.78 | ~$10^8$ |
| Example 5 | | 0.31 | ~$10^4$ |
| Example 6 | | 3.25 | ~$10^6$ |
| Example 7 | | 6.78 | ~$10^6$ |
| Example 8 | | 7.23 | ~$10^8$ |
| Example 9 | | 3.41 | ~$10^6$ |

TABLE 3-continued

|  |  | Charge carrier mobility (cm²/V · s) | on/off ratio (on/off ratio) |
|---|---|---|---|
| Example 10 |  | 0.37 | ~$10^4$ |
| Example 11 | IGO | N/A | N/A |
| Example 12 |  | N/A | N/A |
| Example 13 |  | N/A | N/A |
| Example 14 |  | 1.47 | ~$10^6$ |
| Example 15 |  | 1.07 | ~$10^6$ |
| Example 16 |  | N/A | N/A |
| Example 17 |  | N/A | N/A |
| Example 18 |  | N/A | N/A |
| Example 19 |  | 2.17 | ~$10^6$ |
| Example 20 |  | 3.07 | ~$10^6$ |
| Example 21 | IGZO | $1.55 \times 10^{-4}$ | ~$10^3$ |
| Example 22 |  | 0.09 | ~$10^5$ |
| Example 23 |  | 1.45 | ~$10^6$ |
| Example 24 |  | 2.25 | ~$10^7$ |
| Example 25 |  | 6.07 | ~$10^7$ |
| Example 26 |  | 0.24 | ~$10^6$ |
| Example 27 |  | 0.46 | ~$10^6$ |
| Example 28 |  | 0.11 | ~$10^6$ |
| Example 29 |  | 0.13 | ~$10^6$ |
| Example 30 |  | 0.22 | ~$10^6$ |
| Example 31 |  | 0.16 | ~$10^6$ |
| Example 32 |  | 0.18 | ~$10^6$ |
| Example 33 |  | 0.12 | ~$10^6$ |
| Comparative Example 1 | IZO | 0.72 | ~$10^6$ |
| Comparative Example 2 |  | 1.63 | ~$10^7$ |
| Comparative Example 3 |  | 2.20 | ~$10^7$ |
| Comparative Example 4 | IGO | N/A | N/A |
| Comparative Example 5 |  | $1.24 \times 10^{-4}$ | ~$10^3$ |
| Comparative Example 6 | IGZO | $1.55 \times 10^{-4}$ | ~$10^3$ |
| Comparative Example 7 |  | $2.22 \times 10^{-4}$ | ~$10^3$ |

As shown in Table 3, the charge carrier mobility of the transistors prepared in Example 1~Example 3 of the invention was more excellent than the transistors of Comparative Examples 1~3 using the same IZO precursor (the transistor of Comparative Example 2 showed the charge carrier mobility of 2.20 cm²/V·s). From the above results, it was confirmed that zinc and indium were preferably included in the precursor material at the molar ratio of 1:0.7~1:10 and more preferably included at the molar ratio of 1:0.7~1:5.

The thin film transistors of Example 6~Example 9 of the invention also displayed comparatively excellent charge carrier mobility, compared with those of the transistors of Comparative Examples 1~3 (the transistor of Comparative Example 2 showed the charge carrier mobility of 2.20 cm²/V·s), and this result also supported that the preferable molar ratio of zinc:indium in the precursor material was 1:0.7~1:5.

When zinc and indium were included at the molar ratio of 1:1, as shown in Example 3 and Example 8, the charge carrier mobility was significantly increased. Particularly, the transistor of Example 3 showed the most excellent charge carrier mobility that was as high as 13.8 cm²/V·s at maximum.

When at least three kinds of precursor materials were included as shown in Examples 21~33, the preferable molar ratio of those materials, such as zinc:indium:gallium, was 1:1~3:0.1~2. Compared with the inorganic semiconductor ink compositions of Comparative Examples 1~7 prepared with the precursor composed of nitrate or acetylacetonate alone, instead of using the mixture of nitrate/acetylacetonate, the inorganic thin film transistor prepared with the composition composed of those mixtures showed comparatively high charge carrier mobility and on/off ratio.

Therefore, the inorganic semiconductor ink composition of the present invention favors the preparation of the inorganic thin film transistor with improved electrical characteristics.

EXPERIMENTAL EXAMPLE 2

Thermal Properties of Inorganic Semiconductor Ink Precursor

To investigate the thermal properties of the inorganic semiconductor ink composition prepared according to the present invention, the inorganic semiconductor ink compositions prepared in Comparative Examples 1~3 and Example 3 were dried to eliminate the solvents.

Then, mass changes and exothermic/endothermic behaviors according to heat radiation (10° C./min) of those compositions were investigated by using thermogravimetric analyzer and differential scanning calorimeter (SDT 2060, TA instruments, USA). The results are shown in FIG. 3.

As shown in FIG. 3, the temperature to decompose the organic components of the compositions of Comparative Examples 1~3 was at least 300° C., and particularly the temperature to decompose the organic components of the composition of Comparative example 2 was around 400~500° C. From the above results, it was confirmed that the combustion reaction did not occur in the compositions of Comparative Examples since a strong heating phenomenon was not induced. The composition of Example 3 demonstrated the rapid mass reduction and a significant heating phenomenon at the temperature around 200° C., suggesting that the combustion reaction did occur.

The composition of Example 3 had better electrical characteristics than those of the compositions of Comparative Examples 1~3 as shown in Table 3. This excellent electronic characteristics seemed to be attributed to a spontaneous combustion reaction which was induced when the mixture of the oxidising material nitrate and the fuel material acetylacetonate was heat-treated. More precisely, the spontaneous combustion reaction could lower the temperature for hydrolysis, condensation, and oxide reaction such as organic matter decomposition, so that the oxide thin film could be easily formed.

According to the present invention, when the oxidising material is mixed with the fuel material, a spontaneous combustion reaction occurs and thereby the temperature for forming oxide is lowered, suggesting that the oxide is generated easily and the electrical characteristics can be improved significantly.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended Claims.

What is claimed is:

1. A semiconductor ink composition which comprises a complex, represented by formula 1, incorporating a nitrate of a metal A which is an oxidizing material and incorporating a metal B which is a fuel material; wherein when the metal A and the metal B are respectively zinc and indium; or indium and zinc, and the molar ratio of zinc complex:indium nitrate; or zinc nitrate:indium complex is 1:0.7~1:10, wherein when the metal A and the metal B are respectively indium and gallium; or gallium and indium, and the molar ratio of indium complex:gallium nitrate; or indium nitrate:gallium complex is 1:0.1~1:0.7,

[Formula 1]

wherein, $R_1$, $R_2$ and $R_3$ are each independently hydrogen or $C_1$~$C_2$ alkyl, and the $C_1$~$C_2$ alkyl can be substituted with one or more F.

2. The semiconductor ink composition according to claim 1, wherein the semiconductor ink composition additionally includes a nitrate of metal C as an oxidising material and at least one of the complex represented by formula 1 as a fuel material, wherein the metal C is a metal selected from the group consisting of indium, gallium, zinc, titanium, aluminum, lithium, and zirconium, and the metal C is different from metal A and metal B.

3. The semiconductor ink composition according to claim 1, wherein the semiconductor ink composition additionally includes monoethanolamine as a stabilizer.

4. The semiconductor ink composition according to claim 1, wherein the semiconductor ink composition additionally contains a solvent and the concentration of the mixture composed of the oxidizing material, the fuel material, and the solvent is 0.05~0.25 M.

5. A preparation method of a semiconductor thin film using the semiconductor ink composition of claim 1 comprising the following steps:

generating a film on a substrate by printing or coating the top of the substrate with the semiconductor ink composition of claim 1 (step 1); and heat-treating the film prepared in step 1 (step 2).

6. The preparation method of a semiconductor thin film using the semiconductor ink composition according to claim 5, wherein the printing or coating in step 1) is achieved by the method selected from the group consisting of ink-jet printing, roll printing, gravure printing, aerosol printing, screen printing, roll coating, spin coating, bar coating, spray coating, and dip coating.

7. The preparation method of a semiconductor thin film using the semiconductor ink composition according to claim 5, wherein the heat-treatment in step 2) is performed at 200~350° C.

8. A semiconductor thin film formed on top of the substrate by the method of claim 5.

9. An inorganic thin film transistor wherein the substrate (gate electrode) and the semiconductor thin film of claim 8 are laminated stepwise, a source and a drain electrode are layered on the top of the semiconductor thin film, and the source and the drain electrode are separated from each other at a regular distance.

* * * * *